(12) United States Patent
Bennett et al.

(10) Patent No.: US 7,538,559 B2
(45) Date of Patent: May 26, 2009

(54) SYSTEM AND METHOD FOR REDUCING CURRENT IN A DEVICE DURING TESTING

(75) Inventors: Paul T. Bennett, Phoenix, AZ (US); Randall C. Gray, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/733,079

(22) Filed: Apr. 9, 2007

(65) Prior Publication Data

US 2007/0279069 A1  Dec. 6, 2007

Related U.S. Application Data

(62) Division of application No. 11/444,087, filed on May 31, 2006, now Pat. No. 7,218,119.

(51) Int. Cl.
*G01R 31/08* (2006.01)
*G01R 31/26* (2006.01)

(52) U.S. Cl. .................................. 324/522; 324/719

(58) Field of Classification Search ................ 324/522, 324/719
See application file for complete search history.

(56) References Cited

U.S. PATENT DOCUMENTS

| | | | |
|---|---|---|---|
| 5,677,856 A | 10/1997 | Tani | |
| 6,617,069 B1 | 9/2003 | Hopper | |
| 6,759,856 B2 | 7/2004 | Tse | |
| 6,870,720 B2 | 3/2005 | Iwata | |
| 7,282,905 B2 * | 10/2007 | Chen et al. | ............... 324/158.1 |
| 2004/0201077 A1 | 10/2004 | Momohara | |
| 2005/0162144 A1 | 7/2005 | Kernahan | |
| 2005/0195038 A1 | 9/2005 | Neenan | |
| 2005/0200406 A1 | 9/2005 | Dauphinee | |
| 2005/0225925 A1 | 10/2005 | Sibrai | |

* cited by examiner

*Primary Examiner*—Vincent Q Nguyen
*Assistant Examiner*—Amy He
(74) *Attorney, Agent, or Firm*—Ingrassia, Fisher & Lorenz, P.C.

(57) ABSTRACT

A system (28) includes a microelectronic device (10) including first transistors (22) and second transistors (24), a power supply (40) electrically connected to the first and second transistors to provide power to the first and second transistors such that current flows through the first and second transistors, a switch (32) in operable communication with the second transistors, the switch allowing current to flow from the power supply through the second transistors when in a first mode of operation and preventing current from flowing from the power supply through the second transistors when in a second mode of operation, control circuitry in operable communication with the switch, and current sensing circuitry coupled to the first transistors to detect a test amount of current flowing through at least one of the first transistors when the switch is in the first mode of operation.

18 Claims, 4 Drawing Sheets

SYSTEM AND METHOD FOR REDUCING CURRENT IN A DEVICE DURING TESTING

CROSS REFERENCE TO RELATED APPLICATION

This application is a divisional of Ser. No. 11/444,087 filed on May 31, 2006.

FIELD OF THE INVENTION

The present invention generally relates to a system and method for testing electronic devices, and more particularly relates to a system and method for testing such devices using a reduced amount of current.

BACKGROUND OF THE INVENTION

In recent years, electrical and computing systems that utilize microelectronic devices, such power integrated circuits (IC), have become increasingly complicated. In order to protect various components used in a wide variety of systems, such as automobiles and the like, self-testing features (i.e., built-in testing apparatuses or "testers") are often provided which allow the microelectronic devices to be tested for appropriate shut off current levels.

In order to minimize costs, multiple devices are often tested simultaneously by the same tester, or testers. However, the maximum testing current that can be provided by typical tester is insufficient to fully test some modern devices. For example, some modern power ICs have channels capable of handling maximum peak currents of over 15 A, while most testers are not able to provide more than 10 A. Therefore, multiple testers are often connected in parallel to provide a sufficient amount of current for fully testing such devices.

However, the use of multiple testers defeats the goal of minimizing costs, as more testers are required within the system, which again increases testing costs. Additionally, high current operation considerably raises the temperature of the devices, which reduces the longevity and reliability of the devices.

Accordingly, it is desirable to provide a system and method for testing electronic devices with a reduced amount of current. Additionally, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawings, wherein like numerals denote like elements.

DETAILED DESCRIPTION OF THE INVENTION

The following detailed description is merely exemplary in nature and is not intended to limit the invention or application and uses of the invention. Furthermore, there is no intention to be bound by any expressed or implied theory presented in the preceding technical field, background, brief summary, or the following detailed description. It should also be noted that FIGS. 1-4 are merely illustrative and may not be drawn to scale.

FIGS. 1-4 illustrate a system and method for testing electronic devices using a reduced amount of current. In a first mode of operation, power is provided to the entire device such that a first amount of current flows therethrough. A preferred portion of the device is electrically isolated from a remainder of the device. Power is then provided to the device such that a reduced amount of current flows only through the preferred portion of the electronic assembly. Because the sizes of the conductors within the device are known, the entire device can be tested by observing the amount of current that flows through the portion. Using the known physical proportions, and thus the proportions of the current-carrying capability, of the portion of the device to the entire device, a "control" current (e.g., the shut off current) for the entire device (or simply the amount of current flowing therethrough under a given load) may be determined or the amount of current flowing through the entire device may be regulated.

Figure 1:
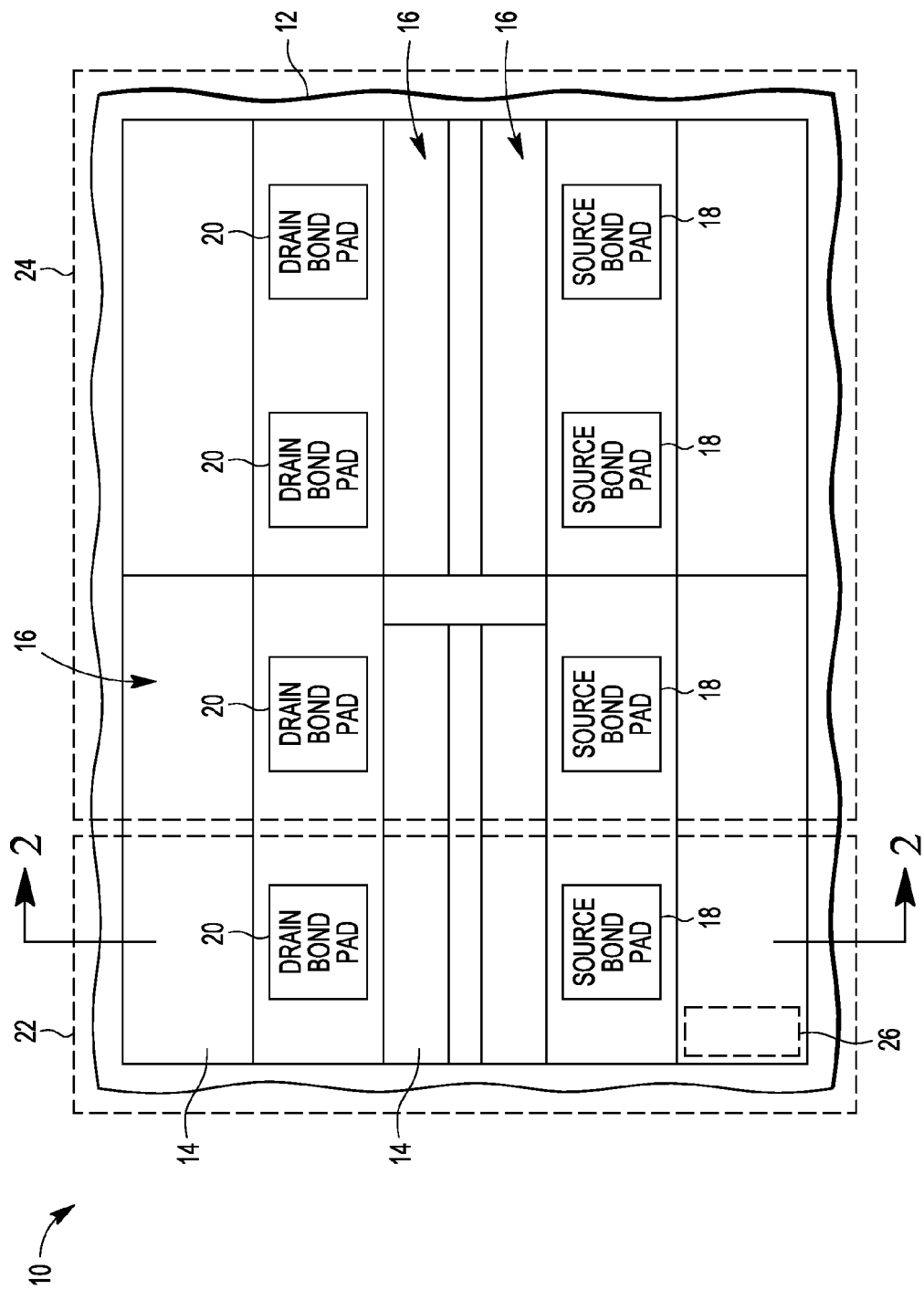
FIG. 1 is a top plan view of a microelectronic device according to one embodiment.
Figure 2:
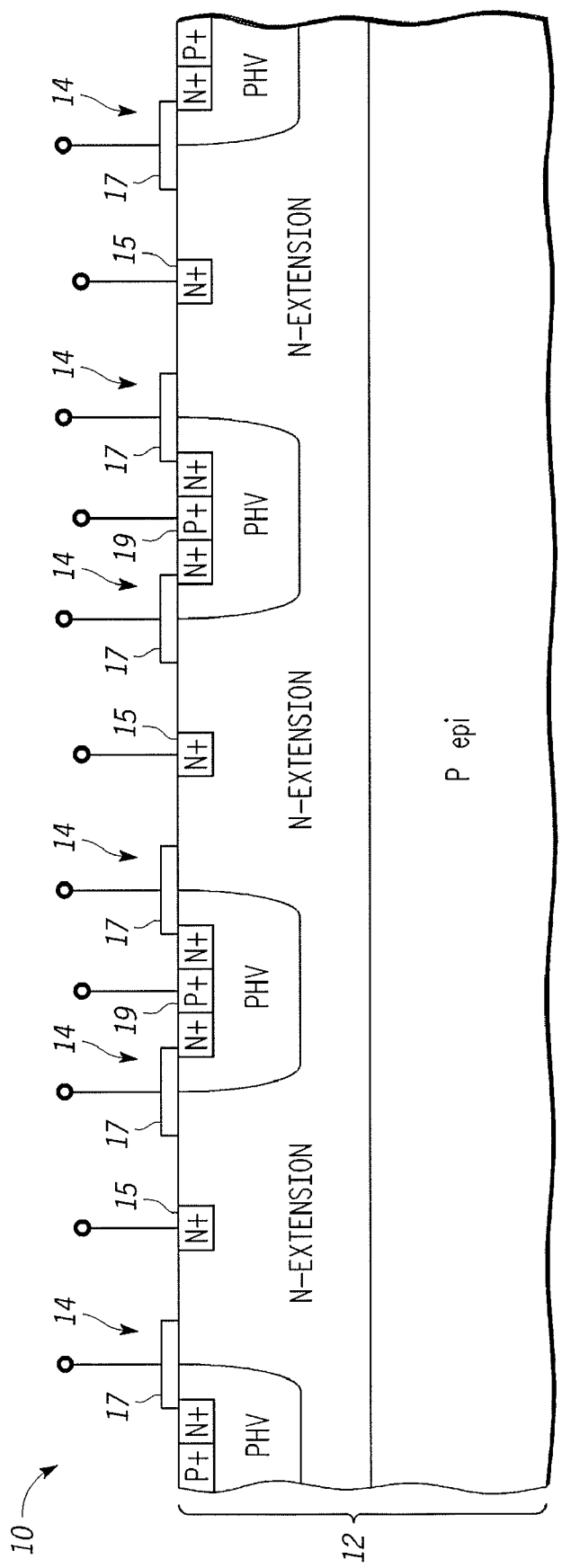
FIG. 2 is a cross-sectional side view of the microelectronic device of FIG. 1 taken along line 2-2.

FIGS. 1 and 2 illustrate an electronic (or microelectronic) device 10 (or assembly), according to one embodiment of the present invention. In one embodiment, the device 10 is in the form of a power field-effect transistor (FET) device, as is commonly understood in the art. The device 10 illustrated in FIGS. 1 and 2 includes a substrate 12 having a plurality of transistors 14 formed thereon including drains 15, gates 17, and sources 19. In one embodiment, the substrate is a semiconductor substrate 12 made of a semiconductor material, such as gallium arsenide (GaAs), gallium nitride (GaN), or silicon (Si). The semiconductor material of the substrate 12 may be of a first conductivity type, or doped with a first dopant type (e.g., P-type) and have several regions and/or layers of varying dopant type and/or concentrations. In one embodiment, the transistors 14 are formed using Lateral Diffused Metal Oxide Semiconductor (LDMOS) processing steps, as is commonly understood in the art.

Referring specifically to FIG. 1, the transistors 14 may be arranged on the substrate 12 in "fingers" which extend across the substrate 12. The device 10 also includes numerous "backend" processing layers 16 (not shown in FIG. 2), including various insulating and conductive layers, vias, and traces, as well as both source bond pads 18 and drain bond pads 20 formed over the backend processing layers 16. Although not illustrated, it should be understood that the source bond pads 18 and the drain bond pads 20 are electrically connected to the source and drain components with the transistors 14 through the conductive vias and traces within the backend processing layers 16.

As will be described in greater detail below, the transistors 14 are arranged in groups or sections, such that all of the transistors 14 within one section are "separated," or can be separated, from the transistors 14 within other sections. Although not illustrated in FIG. 2, the separation between the transistors may be accomplished using isolation diffusion regions, as is commonly understood, or a switching mechanics, as is described below. In the example illustrated in FIG. 1, the device 10 includes a first section 22, a second section 24, and a sense section 26 within the first section 22. The first section 22 covers approximately ¼ of the device 10, and the second section 24 covers approximately ¾ of the device. As such, the first section includes approximately 25% of the total number of individual transistors 14 in the device, while the second section includes approximately 75% of the total number of individual transistors 14. The sense section 26 covers a small portion (e.g., less than 1/50) of the device 10, and likewise includes a small number of transistors 14, such as less than 2%. In one embodiment, the first section 22 includes 100 transistors 14, the second section 24 includes 300 transistors, and the sense section 26 includes 2 transistors. It should be understood that the cross-section sizes, and thus the current-carrying capability, of the individual transistors, as well as the first, second, and test sections 22, 24, and 26, are precisely known such that the relative current-carrying capabilities of the sections 22, 24, and 26 can be determined, as is described below.

Figure 3:
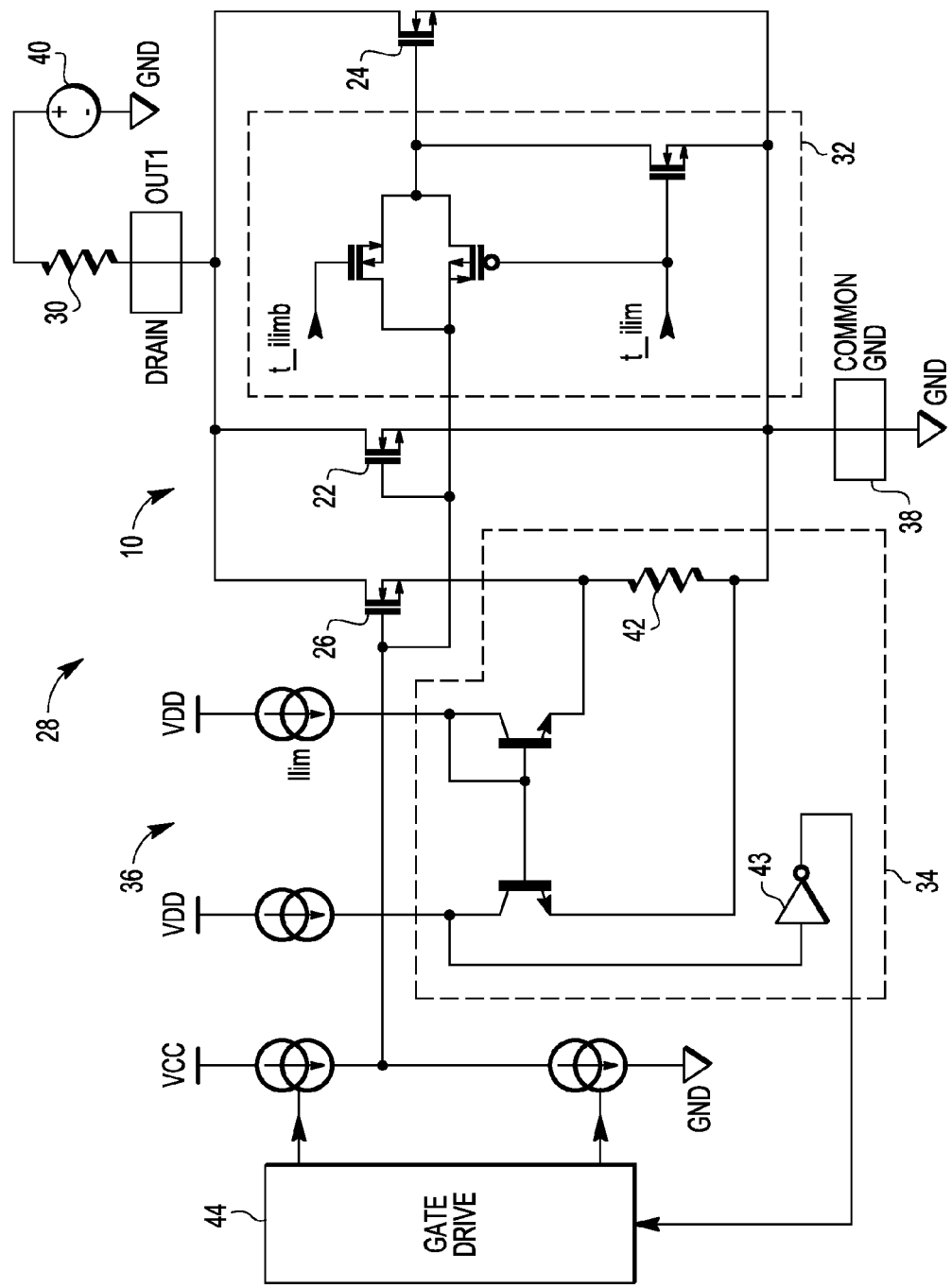
FIG. 3 is a schematic illustrating a system incorporating the microelectronic device of FIG. 1.

FIG. 3 schematically illustrates a system 28 for testing microelectronic devices, such as the device 10 illustrated in FIGS. 1 and 2, using a reduced amount of current, according to one embodiment of the present invention. The system 28 includes the device 10, a resistive load 30, switching circuitry 32, current sensing and limiting circuitry 34 (or control circuitry), and current limit calibration circuitry 36. As shown, within the device 10, the first section 22, the second section 24, and the sense section 26 are connected to a common ground 38. It should be understood that the system 28, and in particular the current sensing and limiting circuitry 34, is merely one example of an embodiment of the present invention, as one skilled in the art will appreciate that multiple variations may be used.

The resistive load 30 is connected to the respective drain conductors of the transistors within each of the first section 22, the second section 24, and the sense section 26 of the device 10, as well as a voltage source 40 (e.g., an automotive battery). The resistive load 30 may be, for example, an inductor, a resistor, a motor, an electric relay, and/or a sensor (e.g., an oxygen sensor). The switching circuitry 32 is connected between the gate of the second portion 24 of the device 10, the current sensing and limiting circuitry 34, and the common ground 38 and includes a series of transistors. The current sensing and limiting circuitry 34 includes transistors, a current sensing resistor 42, which is connected to the source conductors of the transistors in the sense section 26, and a logic gate 43. In the illustrated embodiment, the current sensing and limiting circuitry 34 includes two "NPN" power transistors with a common base. The current limit calibration circuitry 36 includes several current sources connected to the sense section 26, the first section, and the switching circuitry 32, as well as the current sensing and limiting circuitry 34.

As shown, the system 28 also includes a gate drive 44, which includes or is in operable communication with, a processor, to control the switching circuitry 32. Although not specifically illustrated, the system 28 may be a portion of a larger system, such as an automobile, in which the resistive load 30 is a component serving a specific purpose (e.g., head lamps).

During operation, the system 28 is operable in a normal (or first) mode of operation and a "test" (or second) mode of operation. In the normal mode of operation, the switching circuitry 32 is in a "closed" state such that the gates of the transistors within the second section 24 of the device 10 are activated. As a result, current flows through the entire device 10 (i.e., the first section 22, the second section 24, and the sense section 26) to the resistive load 30. In one embodiment, the "full" current (the combined current flowing through sections 22, 24, and 26) is between 8 and 20 A.

As will be appreciated by one skilled in the art, in order to prevent an excessive amount of current from being provided to the resistive load 30, the device 10 is provided with a "shut off" feature, which deactivates the device 10 (i.e., stops the flow of current through the device to the resistive load). In order to ensure that the shut off feature is working properly, the system 28 intermittently tests the device 10. When the system 28 operates in the test mode, an external control function or source toggles the switching circuitry 32 to an "open" state. When the switching circuitry is in the open state, the gates of the transistors within the second section 24 of the device 10 are deactivated such that the transistors within the first section 22 and the sense section 26 are electrically isolated or separated from the transistors within the second section 24. That is, while the system is operating in the test mode, current only flows through the first and sense sections 22 and 26 of the device 10. In one embodiment, the "reduced" amount of current is between 2 and 5 A.

It should be noted that the reduced amount of current, in this embodiment, is approximately 1/4, or 25%, of the combined current. Therefore, the ratio of the reduced current to the combined current is the same as the ratio of the size of the first portion 22 of the device 10 to the size of the entire device 10 (or the approximate ratio of the number of transistors within the first section 22 to the total number of transistors in the device 10). Likewise, the amount of current flowing through the sense section 26 (i.e., the "sense" or test current) is predictably proportional to the combined current flowing through the first and sense section 22 and 26.

With current flowing through only the first and sense portion 22 and 26 of the device 10, the shut off feature of the device 10 may be fully tested using, in the embodiment described above, only 1/4 of the current that is typically required to test such a device. The exact current at which the device shuts off can be adjusted, for example, by altering the strengths of the current sources in the current limit calibration circuitry 36, as well as changing the resistive value of the current sensing resistor 42. Additionally, although not specifically illustrated, the system 28 may include circuitry which varies the amount of time before the shut off occurs based on the exact amount of current being detected. For example, if the current flowing through the first and sense section 22 and 26 is determined to be 4 A, the device 10 may be shut off after 30 ms. However, if the same current is determined to be 6 A, the device may be shut off after 3 ms. Although not shown, additional circuitry, similar to the current sensing and limiting circuitry 36, may be provided to perform such a two-tiered shut off operation, as will be appreciated by one skilled in the art.

One advantage of the method and system described above is that because only a portion of the electronic device is tested, the amount of current required to determine the amount of current flowing through the electronic assembly and/or the shut off current for the entire electronic assembly is reduced. As a result, the number of testing apparatuses, as well as the overall amount of current, required to test multiple devices is reduced. Thus, the cost of the system is minimized. Additionally, because the number of testing apparatuses required is reduced, an increased number of devices can be tested simultaneously. A further advantage is that because the total amount of current flowing though each device during testing is minimized, the temperature of the devices is reduced, which improves the reliability and longevity of the devices.

Other embodiments may have the device divided into sections of different relative sizes. For example, the first section may be any portion of the entire device but is preferably less than 50% of the size of the entire device. Likewise, the sense portion may be any portion of the entire device (or the first section) but is preferably less than 5% of the entire device (or less than 10% of the size of the first section).

Figure 4:
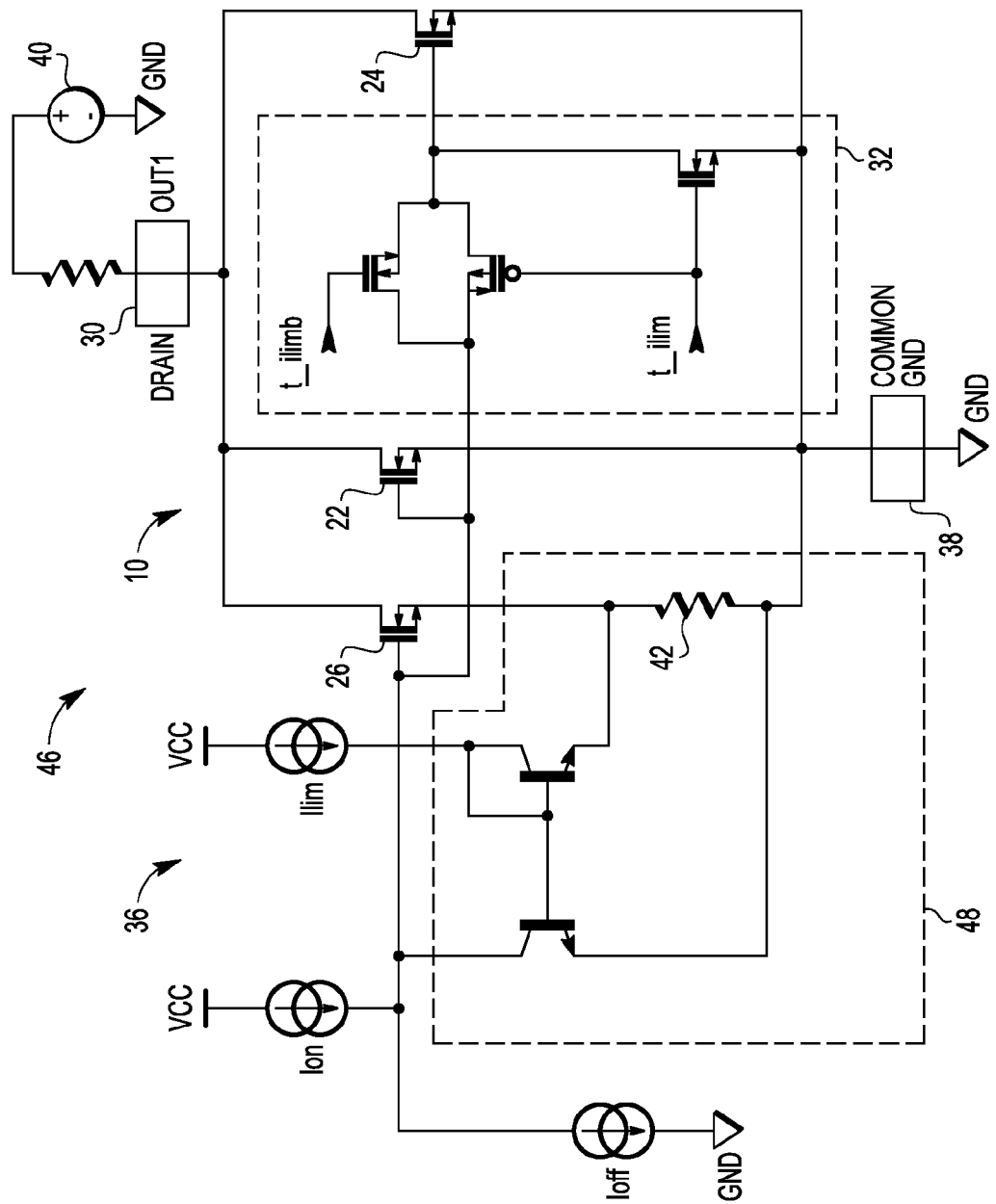
FIG. 4 is a schematic illustrating an alternative system incorporating the microelectronic device of FIG. 1.

Although the embodiment discussed above is describe as testing a shut off current for the device 10, it should be understood that the system may be configured to regulate the amount of current. FIG. 4 illustrates an example of a system 46 which may be used to regulate or limit and hold the amount of current flowing through the device 10, as opposed to determining a shut off current of the device 10. As illustrated, the system 46 may be similar in some aspects, and include some component similar to, the system 28 illustrated in FIG. 3. However, of particular interest, the system 46 shown in FIG. 4 includes current sensing and limiting circuitry 48 which includes a feed back loop that automatically limits and holds the amount of current flowing through the sense portion 26 of the device, as will be appreciated by one skilled in the art. In this manner, the present invention provides a system and method for detecting the total amount of current flowing through the device 10 and shutting off the device if the current exceeds a predetermined level, as well as regulating the amount of current flowing through the entire device to maintain the current at levels to protect the device 10. The shut off current and the regulated current may be referred generically to as a "control" current.

The invention provides a method for testing an electronic device. A portion of the electronic device is electrically isolated from a remainder of the electronic device. Power is provided to the electronic device such that a reduced amount of current flows through only the portion of the electronic device. The reduced amount of current is determined. A combined amount of current flowing through both the portion and the remainder of the electronic device when power is provided to both the portion and the remainder of the electronic device is calculated based on the reduced amount of current.

The electronic device may be configured such that the reduced amount of current is a predetermined percentage of the combined amount of current. The electronic device may include a plurality of transistors. A portion of the plurality of transistors may be within the portion of the electronic device, and a remainder of the plurality of transistors may be within the remainder of the electronic device.

The determination of the reduced amount of current may include providing power to the portion of the electronic device such that current flows through the portion of the electronic device and determining a test amount of current flowing through at least one selected transistor of the portion of the plurality of transistors.

The predetermined percentage of current that runs through the portion of the electronic device may be less than 50 percent of the current that runs through the electronic device. The portion of the electronic device and the portion of the plurality of transistors may be configured such that the test amount of current is a predetermined percentage of the reduced amount of current. The portion of the plurality of transistors may be less than 50 percent of the plurality of transistors, and the at least one selected transistor may be less than 10 percent of the portion of the plurality of transistors.

The test amount of current, the reduced amount of current, and the combined amount of current may be control currents for the electronic device, the portion of the electronic device, and the at least one selected transistor, respectively. The electronic device may include a microelectronic die with an integrated circuit formed thereon.

The invention also provides a method for testing a microelectronic assembly. Power is provided to a plurality of transistors in the microelectronic assembly such that current flows through the plurality of transistors. A predetermined number of the plurality of transistors are electrically isolated. Power is provided to the predetermined number of the plurality of transistors such that current flows through only the predetermined number of the plurality of transistors. A reduced control current for the predetermined number of the plurality of transistors is determined. A total control current for the plurality of transistors based on the reduced control current for the predetermined number of the plurality of transistors is calculated.

The determination of the reduced control current may include providing power to the predetermined number of the plurality of transistors such that current flows through the predetermined number of the plurality of transistors and determining a test control current flowing through at least one selected transistor of the predetermined number of the plurality of transistors and is based on the test control current.

The microelectronic assembly may be configured such that the reduced control current is a predetermined percentage of the total control current and the test control current is a predetermined percentage of the reduced control current. The predetermined number of the plurality of transistors may be less than 50 percent of the plurality of transistors, and the at least one selected transistor may be less than 10 percent of the predetermined number of the plurality of transistors. The microelectronic assembly may be a power integrated circuit and includes a microelectronic die, the plurality of transistors being formed on the microelectronic die.

The invention further provides a system for testing a microelectronic assembly. The system includes a microelectronic device including first transistors and second transistors, a power supply electrically connected to the first and second transistors to provide power to the first and second transistors such that current flows through the first and second transistors, a switch in operable communication with the second transistors, the switch allowing current to flow from the power supply through the second transistors when in a first mode of operation and preventing current from flowing from the power supply through the second transistors when in a second mode of operation, control circuitry in operable communication with the switch, and current sensing circuitry coupled to the first transistors to detect a test amount of current flowing through at least one of the first transistors when the switch is in the first mode of operation.

The system may further include a processor coupled to the current sensing circuitry and configured to calculate a reduced amount of current flowing through the first transistors when the switch is in the first mode of operation based on the test amount of current. The processor may be further configured to calculate a combined amount of current flowing through the first and second transistors when the switch is in the second mode of operation based on the reduced amount of current.

The test amount of current may be a predetermined percentage of the reduced amount of current, and the reduced amount of current may be predetermined percentage of the combined amount of current. The test amount of current, the reduced amount of current, and the combined amount of current may be control currents for the at least one of the first transistors, the first transistors, and the first and second transistors, respectively.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A system comprising:
   a microelectronic device including first transistors and second transistors;
   a power supply electrically connected to the first and second transistors to provide power to the first and second transistors such that current flows through the first and second transistors;
   a switch in operable communication with the second transistors, the switch allowing current to flow from the power supply through the second transistors when in a first mode of operation and preventing current from flowing from the power supply through the second transistors when in a second mode of operation;
   control circuitry in operable communication with the switch;
   current sensing circuitry coupled to the first transistors to detect a test amount of current flowing through at least one of the first transistors when the switch is in the first mode of operation; and
   a processor coupled to the current sensing circuitry and configured to calculate a reduced amount of current flowing through the first transistors when the switch is in the first mode of operation based on the test amount of current and calculate a combined amount of current flowing through the first and second transistors when the switch is in the second mode of operation based on the reduced amount of current.

2. The system of claim 1, wherein the test amount of current is a predetermined percentage of the reduced amount of current and the reduced amount of current is a predetermined percentage of the combined amount of current.

3. The system of claim 1, wherein the test amount of current, the reduced amount of current, and the combined amount of current are control currents for the at least one of the first transistors, the first transistors, and the first and second transistors, respectively.

4. The system of claim 1, wherein the microelectronic device comprises a plurality of transistors, the first transistors are less than 50 percent of the plurality of transistors, and the at least one of the first transistors is less than 10 percent of the first transistors.

5. The system of claim 4, wherein the test amount of current is less than 50 percent of the combined amount of current.

6. The system of claim 4, wherein the first transistors are less than 25 percent of the plurality of transistors.

7. The system of claim 4, wherein the at least one of the first transistors is less than 2 percent of the plurality of transistors.

8. The system of claim 4, wherein the microelectronic device is a power integrated circuit and includes a microelectronic die, the plurality of transistors being formed on the microelectronic die.

9. A system for testing an electronic device having first transistors and second transistors, the system comprising:
   a power supply electrically connectable to the first and second transistors to provide power to the first and second transistors such that current flows through the first and second transistors;
   a switch to allow current to flow from the power supply through the second transistors when in a first mode of operation and prevent current from flowing from the power supply through the second transistors when in a second mode of operation;
   control circuitry in operable communication with the switch;
   current sensing circuitry coupled to the first transistors to detect a test amount of current flowing through at least one of the first transistors when the switch is in the first mode of operation; and
   a processor coupled to the current sensing circuitry and configured to calculate a reduced amount of current flowing through the first transistors when the switch is in the first mode of operation based on the test amount of current and to calculate a combined amount of current flowing through the first and second transistors when the switch is in the second mode of operation based on the reduced amount of current.

10. The system of claim 9, wherein the test amount of current is a predetermined percentage of the reduced amount of current and the reduced amount of current is a predetermined percentage of the combined amount of current.

11. The system of claim 9, wherein the test amount of current, the reduced amount of current, and the combined amount of current are control currents for the at least one of the first transistors, the first transistors, and the first and second transistors, respectively.

12. The system of claim 9, wherein the microelectronic device comprises a plurality of transistors, the first transistors are less than 50 percent of the plurality of transistors, and the at least one of the first transistors is less than 10 percent of the of the first transistors.

13. The system of claim 12, wherein the test amount of current is less than 50 percent of the combined amount of current, the first transistors are less than 25 percent of the plurality of transistors, and the at least one of the first transistors is less than 2 percent of the plurality of transistors.

14. A system comprising:
   a microelectronic device comprising a plurality of transistors including first transistors and second transistors, the first transistors being less than 50 percent of the plurality of transistors;
   a power supply electrically connected to the first and second transistors to provide power to the first and second transistors such that current flows through the first and second transistors;
   a switch in operable communication with the second transistors, the switch allowing current to flow from the power supply through the second transistors when in a first mode of operation and preventing current from flowing from the power supply through the second transistors when in a second mode of operation;
   control circuitry in operable communication with the switch;
   current sensing circuitry coupled to the first transistors to detect a test amount of current flowing through at least one of the first transistors when the switch is in the first mode of operation, the at least one of the first transistors being less than 10 percent of the first transistors; and
   a processor coupled to the current sensing circuitry and configured to calculate a reduced amount of current flowing through the first transistors when the switch is in the first mode of operation based on the test amount of current and to calculate a combined amount of current flowing through the first and second transistors when the switch is in the second mode of operation based on the reduced amount of current.

15. The system of claim 14, wherein the test amount of current is a predetermined percentage of the reduced amount of current and the reduced amount of current is a predetermined percentage of the combined amount of current.

16. The system of claim 15, wherein the test amount of current, the reduced amount of current, and the combined amount of current are control currents for the at least one of the first transistors, the first transistors, and the first and second transistors, respectively.

17. The system of claim 16, wherein the test amount of current is less than 50 percent of the combined amount of current, the first transistors are less than 25 percent of the plurality of transistors, and the at least one of the first transistors is less than 2 percent of the plurality of transistors.

18. The system of claim 17, wherein the microelectronic device is a power integrated circuit and includes a microelectronic die, the plurality of transistors being formed on the microelectronic die.

* * * * *